(12) United States Patent
Steckman

(10) Patent No.: US 9,461,644 B2
(45) Date of Patent: Oct. 4, 2016

(54) METHOD AND APPARATUS FOR TAP-SENSING ELECTRONIC SWITCH TO TRIGGER A FUNCTION IN AN ELECTRONIC EQUIPMENT

(71) Applicant: Michael Steckman, Los Angeles, CA (US)

(72) Inventor: Michael Steckman, Los Angeles, CA (US)

( * ) Notice: Subject to any disclaimer, the term of this patent is extended or adjusted under 35 U.S.C. 154(b) by 816 days.

(21) Appl. No.: 13/757,711

(22) Filed: Feb. 1, 2013

(65) Prior Publication Data

US 2013/0194030 A1 Aug. 1, 2013

Related U.S. Application Data

(60) Provisional application No. 61/593,686, filed on Feb. 1, 2012.

(51) Int. Cl.
| | | |
|---|---|---|
| *H01H 35/00* | (2006.01) | |
| *H01H 83/00* | (2006.01) | |
| *H03K 17/945* | (2006.01) | |
| *H03K 17/94* | (2006.01) | |

(52) U.S. Cl.
CPC .......... *H03K 17/945* (2013.01); *H03K 17/941* (2013.01); *H03K 2217/94052* (2013.01); *H03K 2217/94108* (2013.01)

(58) Field of Classification Search
USPC ............ 307/116; 327/517; 323/324; 398/106
See application file for complete search history.

(56) References Cited

U.S. PATENT DOCUMENTS

| | | | | |
|---|---|---|---|---|
| 4,803,418 A | * | 2/1989 | Ritchie | H03K 17/725 307/117 |
| 2008/0048878 A1 | * | 2/2008 | Boillot | G06F 3/017 340/686.1 |
| 2012/0174734 A1 | * | 7/2012 | Dorfman | G10D 13/006 84/422.1 |
| 2013/0156433 A1 | * | 6/2013 | Blair | H03K 17/941 398/106 |

* cited by examiner

*Primary Examiner* — Rexford Barnie
*Assistant Examiner* — Xuan Ly

(57) ABSTRACT

An electronic switch, or an electronic equipment having such switch that has a tap-sensing detection region for a user to perform finger-tapping, foot-tapping, or other finger movements on a contact surface in this region and effectuate sending of a signal to turn on, turn off, or perform other contemplated functions of the electronic equipment. This switch emits a radiation, such as infrared light, towards the detection region. The reflection of the radiation off of an object is collected and compared to a predetermined value. If there is a match, the switch would send a signal to the device to perform the predetermined function. In operation, the switch would allow an electrical equipment to have a "virtual switch" where the user can control the device by manipulating his finger or his foot in the designated detection region. The equipment may optionally have a LED illuminator to shine a lit marking indicating where the contact surface is and how it is to be used.

19 Claims, 12 Drawing Sheets

METHOD AND APPARATUS FOR TAP-SENSING ELECTRONIC SWITCH TO TRIGGER A FUNCTION IN AN ELECTRONIC EQUIPMENT

CROSS-REFERENCE TO RELATED APPLICATIONS

This application claims priority to U.S. Provisional Patent No. 61/593,686, filed on Feb. 1, 2012, which is hereby incorporated by reference in its entirety.

BACKGROUND OF THE INVENTION (1) Field of the Invention

The field of the invention is electrical switches, and electrical controllers.

(2) Description of Related Art Including Information Disclosed Under 37 CFR 1.97 and 1.98

Typical electronics have power switches or control switches placed on the body of electronic equipment for a user to control operation of the electronic equipment. Having such switches on the body of the electronic equipment can negatively hinder/restrict the aesthetic creativity in the design of the overall looks. This is because the designer would now have to consider blending the controller design into the rest of the overall design.

There have been attempts to minimize size of controllers so that controller features are less prominent to the eyes. An example of this is televisions with small buttons. Other attempts include positioning such buttons on the side of the television so these controllers are not readily seen. There are undesirable drawbacks to these solutions. Buttons that are hidden made it harder for a user to control the device. Also, buttons that are small made it harder for people with big hands to accurately press the right buttons.

There have been discussions in the industry about electronic equipments that recognize hand gestures of a user, and certain hand gestures represent certain commands to the electronic equipment. The disadvantage of this type of control is that it may not be appropriate for people with certain disabilities. Also, it may be harder for older people to learn about this type of controller.

Another problem the industry has always tried to resolve is to create effective child-proof controllers for electronic devices. Young children are quick to recognize where buttons are on electronic equipment, and parents often have to place electronic equipment out of the reach of their children to prevent their children from playing with expensive equipment.

There continues to be a need for effective ways to provide electronic control switches that is child-proof. And, there continues to be a need for a way to discreetly place switches and control elements on electronic equipment. Further, there continues to be a need for easy-to-learn controller switches.

All referenced patents, applications and literatures are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply. The invention may seek to satisfy one or more of the above-mentioned desires. Although the present invention may obviate one or more of the above-mentioned desires, it should be understood that some aspects of the invention might not necessarily obviate them.

BRIEF SUMMARY OF THE INVENTION

The inventive subject matter contemplated is an electrical switch capable of sending a command to an electronic equipment to turn on/off, increase/decrease volume, and/or other useful commands, based on a user's finger-tapping motion within a certain detection region. More broadly speaking, the contemplated switch can be designed to detect many types of user movement within a certain detection region. In more specific embodiments, it can detect a foot-tapping, finger-tapping, a finger performing a "sliding" action across a surface in a detection region, a finger performing a "circling" action across a surface in a detection region, etc. In general, as long as certain contemplated conditions (that are detectable based on reflective radiation) are met within a detection region, the switch will send the contemplated command to the electronic equipment. Various contemplated conditions will be discussed in more details below.

This switch can be used to control various types of electronic equipment. One skilled in the art will recognize that any known electronic equipment requiring user control can implement the instant inventive subject matter. While some electronic equipment, depending on its usage and the environment to which it is used, may not be appropriate to use the contemplated switch system, one skilled in the electronic art can readily determine whether or not the contemplated switch disclosed herein can be appropriately implemented in an electronic equipment of choice, to achieve the desired objective of controlling by finger-tapping/foot-tapping or other finger movements on a surface.

Among the various available electronic equipment that are suitable for use with this switch, musical instruments such as an electric drum set, or a virtual bass drum, would work particularly well.

Other contemplated consumer electronic products are, lighting fixtures, audio/visual equipment, and electronically controlled water faucets.

As for the technology behind detecting contemplated motions within the detection region, the contemplated electrical switch has a radiation source to project a projected radiation into this detection region. The radiation is detectable based on the reflection of the radiation off of whatever object located within the detection region, as will be discussed in further detail below.

The contemplated system further includes a detector and a microprocessor to collect and process raw data relating to the reflection from the detection region. The switch will recognize certain patterns, within a reasonable degree of error, that match the predetermined triggering patterns.

The detector as mentioned above may be located at various angles and locations of the electrical equipment to which the contemplated system controls. The detector can also be located physically separate from the main housing of the device. Preferably, the detector is located somewhere above the detection region.

In essence, the contemplated system would allow an electrical equipment to have a "virtual switch," or an "invisible switch," where the user can control the device by tapping his finger or tapping his foot in the designated detection zone. The designation of the detection zone can be explicit, and can be implicit.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

It should be noted that the drawing figures may be in simplified form and might not be to precise scale. In reference to the disclosure herein, for purposes of convenience and clarity only, directional terms, such as, top, bottom, left, right, up, down, over, above, below, beneath, rear, front, distal, and proximal are used with respect to the accompanying drawings. Such directional terms should not be construed to limit the scope of the invention in any manner.

DETAILED DESCRIPTION OF THE INVENTION

The invention and its various embodiments can now be better understood by turning to the following detailed description of the preferred embodiments, which are presented as illustrated examples of the invention defined in the claims. It is expressly understood that the invention as defined by the claims may be broader than the illustrated embodiments described below.

Figure 1:
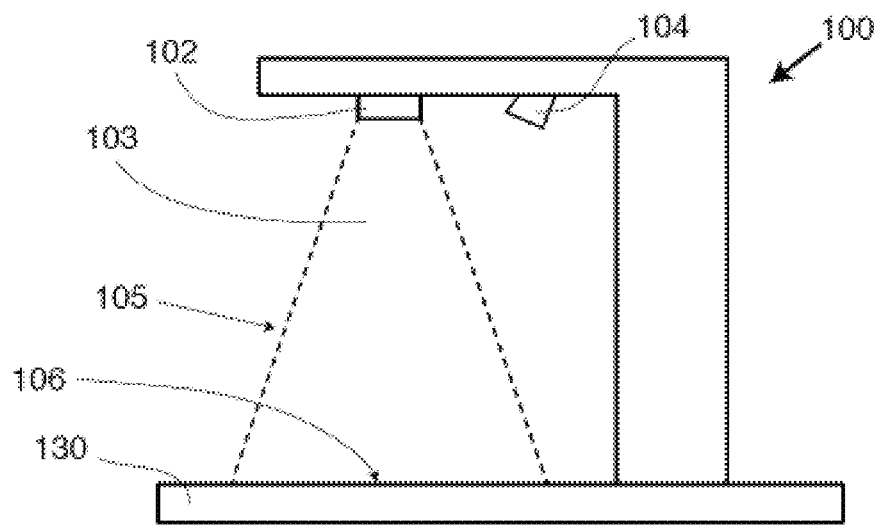
FIG. 1 is a side view of a first embodiment of a device having the contemplated detection unit and a designated detection region according to an aspect of the inventive subject matter.

Referring now to FIG. 1, the contemplated device 100 has an electrical switch comprising a radiation source 102 shining a radiation 103, a detector 104, a detection region 105, a marked (i.e., explicitly indicated) or unmarked (i.e., implicitly indicated) contact surface 106 on an optional platform 130, and a microprocessor 000. These elements will ensure that when the switch is used in combination with electronic equipment, a user may effectuate certain predetermined functions of the electronic equipment by tapping a finger, tapping a foot, or by performing other motions in the detection region, as will be discussed in more details below.

Figure 2:
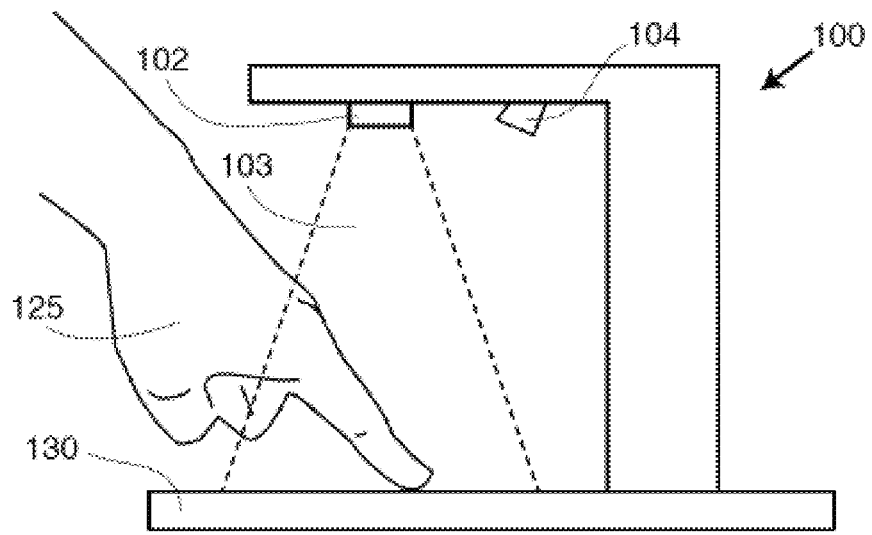
FIG. 2 is a side view of a first embodiment of the device in FIG. 1, with a user's finger entering into the designated detection zone and placing the finger tip on a surface, according to an aspect of the inventive subject matter.
Figure 3:
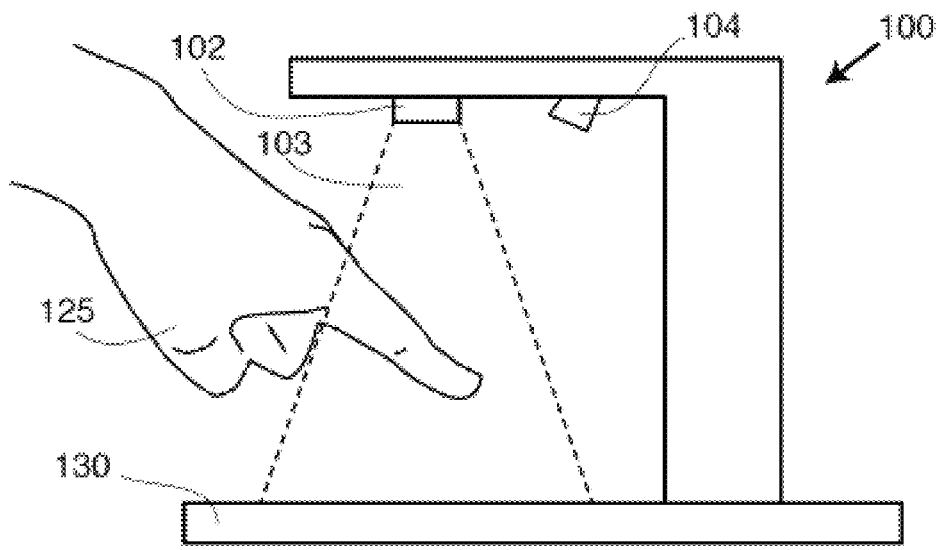
FIG. 3 is a side view of a first embodiment of the device in FIG. 1, with a user's finger raised from its position in FIG. 2, according to an aspect of the inventive subject matter.
Figure 4:
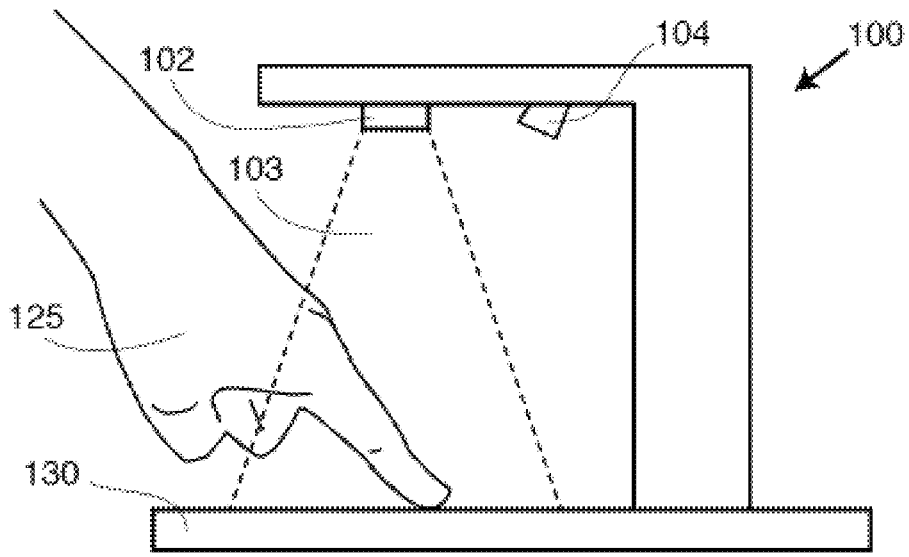
FIG. 4 is a side view of a first embodiment of the device in FIG. 1, with a user's finger lowered from its position in FIG. 3, touching the surface, completing a two-tapping motion, according to an aspect of the inventive subject matter.

FIGS. 2-4 illustrate a series of finger-tapping motion of hand 125 onto contact surface 106 of platform 130. Although FIGS. 1-4 shows a two-tapping motion, it should be understood that it is a choice of design to set the threshold value at only one tapping, or two-tapping, three-tapping, or any other repetition of tapping.

In one embodiment, a one-tapping motion, or a single-tapping motion, is completed once the finger leaves the contact surface 106 of platform 130 as shown in FIG. 3. In another embodiment, the one-tapping motion is completed once the finger lands on contact surface 106 of platform 130 as shown in FIG. 2.

In one embodiment, a two-tapping motion, or a double-tapping motion, is completed once the finger in FIG. 4 leaves the contact surface 106. In another embodiment, the two-tapping motion is completed once the finger lands on contact surface 106 as shown in FIG. 4.

Furthermore, the system may be designed such that a specific number of tapping means a specific command. For example, two-tapping means turn on the system, and five-tapping means turn off the system. This type of design would avoid sending mistaken command, and avoid false turn-on.

In a preferred embodiment, the inventive subject matter is the switch itself. In a further preferred embodiment, the inventive subject matter is the electronic equipment implementing such switch. In yet another preferred embodiment, the inventive subject matter is about a method of using tap-sensing and other finger motion-sensing switches to operate electronic equipment. In some preferred embodiments, the contemplated switch would allow an electronic equipment to have a "virtual switch," or "invisible switch" where the user can control the device by manipulating his finger or his foot on a contact surface (i.e., a surface) in a detection region, which can be physically separate or separable from the electronic equipment. For example, in the embodiment as shown in FIGS. 1-4, a user would have to touch the platform 130 (which is part of the electronic device 100) in order to turn on the device 100. In the example as shown in FIGS. 5A-5F, a user may control the electronic equipment (i.e., the desk lamp 200) without having to physically touch the electronic equipment.

Figure 5A:
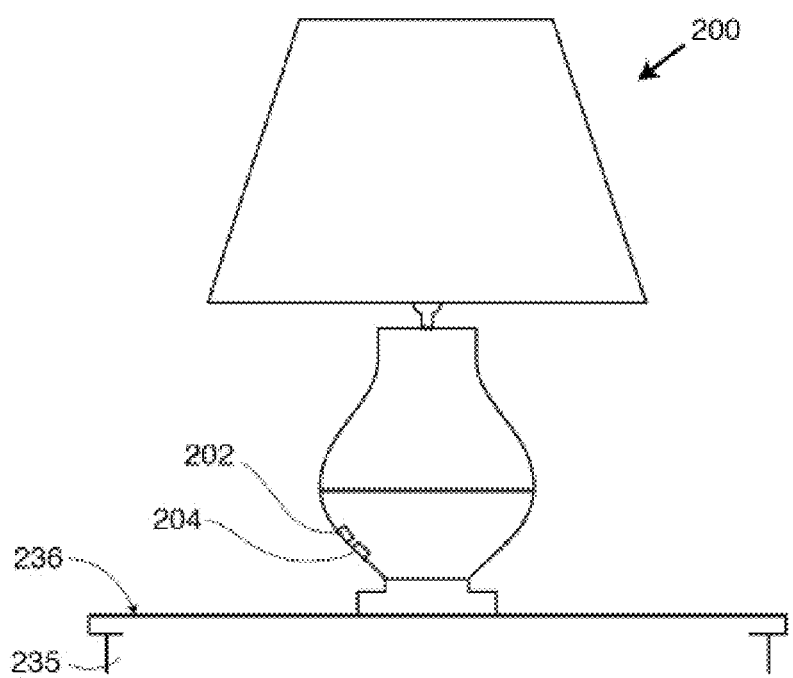
FIG. 5A is a side view of one embodiment of a desk lamp implementing the inventive subject matter.
Figure 5B:
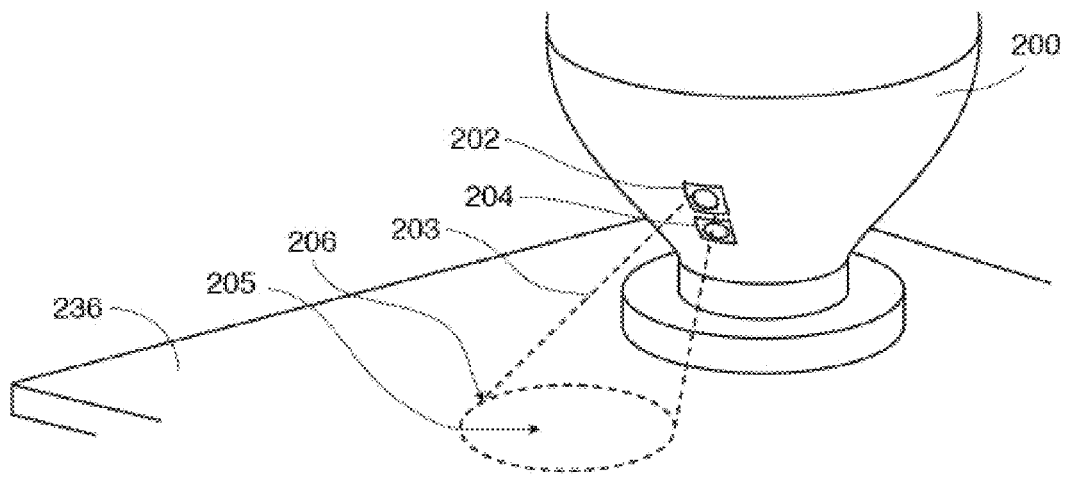
FIG. 5B is a close-up perspective view of the desk lamp of FIG. 5 illustrating its detection region.
Figure 5:
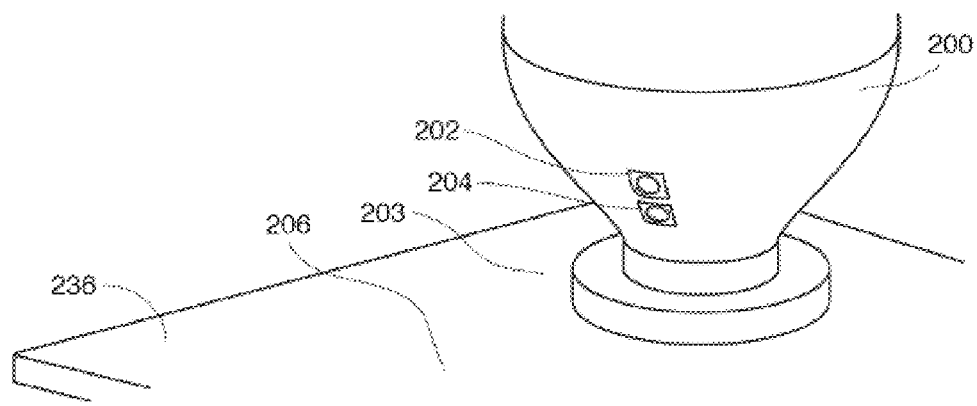
FIG. 5C is a close-up perspective view of one embodiment the desk lamp of FIG. 5 in operation where its detection zone is implicit, and hidden.
FIG. 5D is a close-up perspective view of another embodiment of the desk lamp of FIG. 5 in operation where its detection zone is explicitly indicated on the table surface, visible to a user.
Figure 5:
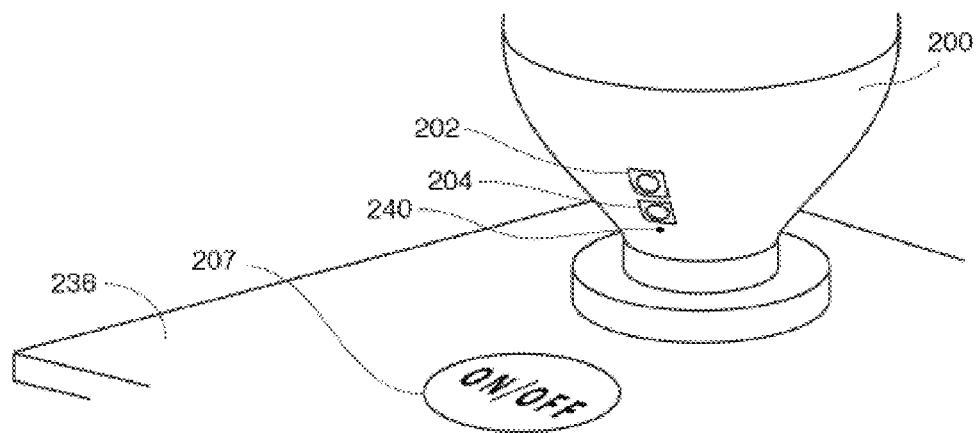

Referring now to FIGS. 5A-5D, a desk lamp 200 is shown having a radiation source 202, a detector 204, where the desk lamp 200 is set on top of the top surface 236 of a table 235. The radiation source 202 emits radiation 203 into detection region 205. FIG. 5C shows the radiation source 202 in operation, and the radiation is invisible to the human eyes.

FIG. 5C shows one embodiment where the desk lamp 200 does not explicitly show a user where the contact surface is for finger-tapping. Only a user who has read the user's manual, or has experience operating one, would recognize where to tap his finger to turn on and off the desk lamp.

FIG. 5D shows another embodiment where the desk lamp 200 explicitly shows a user where the contact surface is for finger-tapping by shining a LED marking 207 onto table top 236 using a LED illuminator 240 located on the desk lamp. Here, it can be easily understood by a first time user having no experience at all to turn on this desk lamp 200 because of the explicit marking 207.

There exists another embodiment (not shown in the figures) where the desk lamp 200 has its emitter 202 and detector 204 angled such that it can make a small area on the wall across the room the contact surface 205. Because this contact surface 205 is quite a distance from the lamp 200, it is preferred to use a LED illuminator so a user walking into the room can recognize where to tap his finger.

There exists yet another embodiment (not shown in the figures) installed in a room where a ceiling light installed on the ceiling has its emitter and detector physically located apart from the ceiling light. This way, the emitter and detector can be freely installed at a convenient location base on the need of the user. For example, the emitter and detector assembly can be installed above an area near the entrance of the room so a contact surface can be assigned on the wall near where a typical light switch would be located. This arrangement can apply to any other electronic equipment where having such remotely located emitter/detector can offer much needed freedom in changing the location of contact surface. The contemplated remote emitter/detector can be electrically connected to the electronic equipment by known wire or wireless methods.

Figure 6:
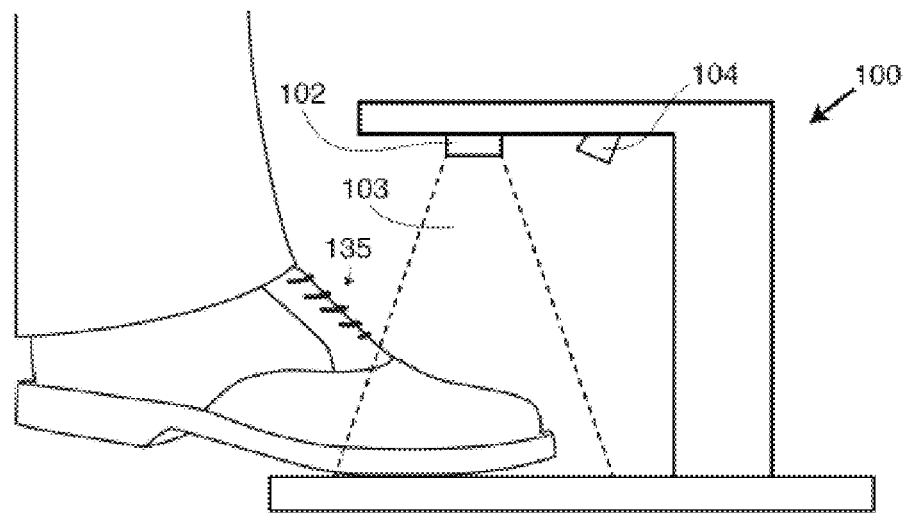
FIG. 6 is a side view of another embodiment of the inventive subject matter to detect a foot-tapping motion showing a user's foot entering into the designated detection zone and placing the foot on a surface, according to an aspect of the inventive subject matter.
Figure 7:
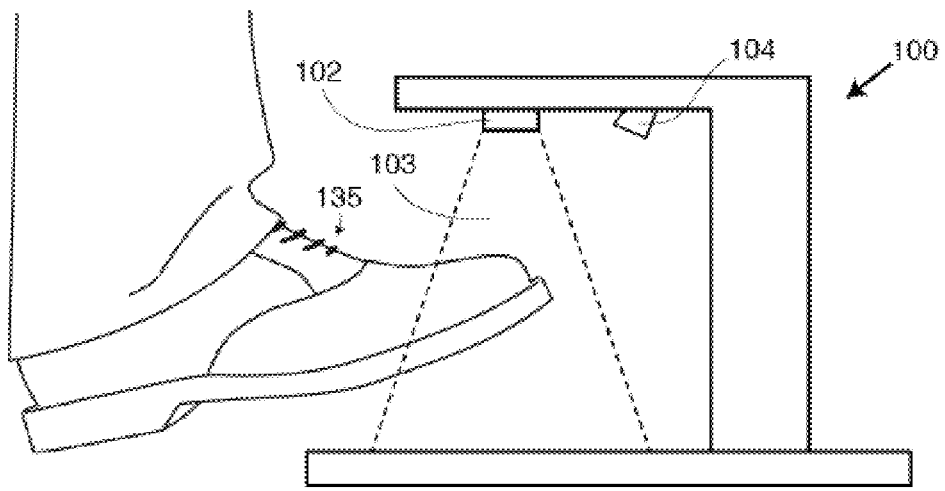
FIG. 7 is a side view of the embodiment in FIG. 6, with a user's foot raised from its position in FIG. 6, according to an aspect of the inventive subject matter.
Figure 8:
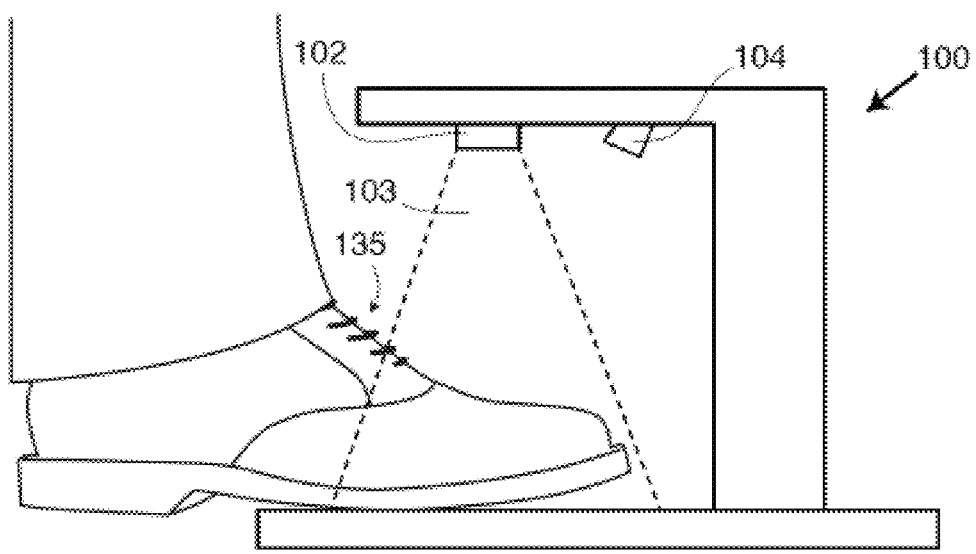
FIG. 8 is a side view of the embodiment in FIG. 6, with a user's foot lowered from its position in FIG. 7, touching the surface, completing a two-tapping motion, according to an aspect of the inventive subject matter.

FIGS. 6-8 illustrate the contemplated device 100 of FIG. 1 except here it is being used to detect foot-tapping. Operation and design of this embodiment is similar to that discussed for device 100 of FIG. 1.

Other consumer products are also contemplated to use the technology and ingenuity of the inventive subject matter disclosed herein. For example, an electronic water faucet (not shown) can implement this switch, wherein the switch has a LED illuminator that shines a lit marking on a surface area (i.e., the contact surface) near the wash bowl for a user to tap his finger on the surface to turn on the water. Alternatively, the LED illuminator can shine a lit marking on the floor (i.e., the contact surface) for a user to tap his foot on the floor to turn on the water, providing a sanitary solution in hospital and other healthcare-related environments.

The contact surface as discussed in this specification can mean a contact surface on the optional platform that is part of the device as exemplified in FIGS. 1-4, or on many different surfaces of any nearby fixture, a nearby furniture piece, a floor, or on the wall. The contemplated surface can be made of any suitable materials capable of allowing "contact" by a finger or by a foot, performing the contemplated movements illustrated in this specification. The contact surface does not have to be flat.

With respect to explicitly indicating a contact surface 206 (which can be on a platform of the device or on an adjacent surface not part of the electronic device), it can be indicated by a LED illuminator. Alternatively, it can be indicated by a sticker or printed graphics. Also alternatively or in combination of, if the contact surface is on a platform, then the platform can have a different texture from surrounding surface to implicitly indicate where the contact surface is.

In another embodiment, the detection region is a marked by a second projected light source to shine a marking onto the stationary object, wherein a purpose of the marking is to educate a user to understand where and how the contact surface is used. For example, the marking can resemble a button, a slider, a turn-knob, or a mixture of these.

In yet another embodiment, the detection region is a region having a marking marked by printed graphics, wherein the marking resembles a button, a keyboard, a slider, a turn-knob, or a mixture of these.

In further contemplated embodiments, the detection region is a region distinguished by an imprint, an etching, or a modified surface material.

Figure 9:
FIG. 9 is an illustration of one embodiment of explicitly indicated switch for finger-tapping.

In one embodiment, the lit marking shone on the surface area is a green circular marking with the words "TAP TO TURN ON." In another embodiment, the lit marking shone on the surface area is a green "ON/OFF" as shown in FIG. 9. The user then taps his finger on the circular marking, thereby turning on the faucet and allowing the water to flow out of the faucet. This faucet may optionally be advantageously enhanced by changing a color or a wording in the lit marking depending on the status of the switch. For example, if the switch has been turned on, the lit marking can optionally be changed from a green "TAP TO TURN ON" marking, to a red "TAP TO TURN OFF" marking. In a second example, if the switch has been turned on, the lit marking can optionally be changed from a green "ON/OFF" marking, to a red "ON/OFF" marking. The user then taps his finger on the red lit marking to turn off the faucet. The lit marking then changes back to a green "TAP TO TURN ON," or "ON/OFF."

In yet another embodiment of the contemplated system, a stereo system having the instant switch design may be placed on top of a credenza in a room. This stereo system has an illuminating LED marker that shines a lit button-shaped lit marking (similar to that shown in FIG. 9) onto the top surface of the credenza right in front of where the stereo system is placed. The lit button-shaped lit marking has the words "TAP-HERE" on the top surface. This stereo system can be moved onto another furniture piece, and it would shine such lit button on the surface of whichever furniture piece the stereo is placed upon. The stereo system allows the user to selectively turn off this illuminating LED marker to optionally make the marking "invisible," so no one would know where the contact surface is except him.

In one embodiment of the stereo example, the microprocessor and the detector is designed to detect a tapping on a contact surface where the contact surface is level with whichever table surface the stereo system is placed on. In other words, if the user were to place this stereo system on the edge of a credenza, and allows the LED illuminator to shine a marking on the floor where the user's foot is, the stereo system would not recognize a finger-tapping or foot-tapping on the marking that is on the floor. In a further embodiment, the microprocessor and detector would be able to process reflection whether or not the detection region is on the same plane as the surface the stereo system is placed on. In other words, if the user were to place this stereo system on the edge of the credenza, and allows the LED illuminator to shine a marking on the floor where the user's foot is, the stereo system would be able to recognize a finger-tapping or foot-tapping on the marking that is on the floor. The system may even recognize tapping by other objects on the marking, such as tapping using a cane.

Radiation Source and Reflection

Referring back to FIG. 1, which illustrates a general arrangement of parts in an embodiment of the inventive subject matter. Here, the switch has a radiation source 102. The radiation source 102 projects a radiation 103 into a designated detection region 105. A preferred radiation type is infrared radiation. Other known radiation types of different wavelength can be used in the alternative, as will be by choice of design based on the application of the equipment being controlled.

Various types of reflected radiation systems are in use today. Examples of these systems include active radar detection. In such a system, pulses are emitted at a constant rate. Reflections of the pulses can be detected and used to determine the motion of an object over time. This is done by measuring the strength of the reflections that correspond to a distance of an object. Range is determined by tracking an object over time to determine related direction and speed.

As the radiation 103 enters the designated detection region 105, some of the projected radiation will reflect off of stationary and moving objects in the detection region. The technology necessary to use reflective light to detect movement in front of a detector is well known.

In one preferred embodiment, whether or not the switch is triggered is based on changes in the detected reflection off of stationary objects in the detection region. For example, in FIGS. 1-4, whether or not the switch is triggered is based on changes in the detected reflection off of the platform 130. In another preferred embodiment, whether or not the switch is triggered is based on changes in the detected reflection off of moving objects in the detection region. For example, in FIGS. 1-4, whether or not the switch is triggered can be based on changes in the detected reflection off of the moving hand 125 in the detection region 105. In yet another embodiment, whether or not the switch is triggered, is based on changes in the detected reflection off of both the moving objects in the detection region and reflection off of the stationary objects in the detection region, or the changes in their relative positions.

Thus, in the example of FIGS. 1-4 where the switch is designed to sense a finger-tapping motion in the detection region 105, one contemplated embodiment can sense the finger-tapping based on radiation reflection off of the finger as a user's hand 125 enters the detection region 105 and taps a finger in the detection region 105.

In the embodiment as shown in FIGS. 5A-5D, the switch can sense the finger-tapping based on radiation reflection off of a stationary table surface 236 and how this reflection off of the table surface changes when a hand enters the detection region 205 to tap a finger on the contact surface 206.

It should be noted that in some embodiments, the emitter can be installed under the contact surface. For example, within a bass drum pedal. The emitter would point upwards towards a user's foot.

Detector

With respect to the detector, it is shown in FIG. 1 as being coupled in close proximity to the radiation source. One skilled in the art will readily understand, that there are many other suitable locations and angles to install such detector so long as it is capable of collecting raw data from the detection region. The detector may even be installed underneath a transparent glass table surface on which the finger-tapping is to take place. This way, detector located underneath the glass surface points upwards and collects raw data from the other side of the transparent glass.

The contemplated detector is provided to collect raw data relating to the reflection from the detection region. As discussed above, this raw data is on reflection changes as a user introducing a moving object into the designated detection region and moves said moving object in the detection region. This moving object may be a hand, a finger, or a foot.

The detector as mentioned above may be located at various angles and locations of the electrical equipment to which the contemplated system controls. Preferably, the detector is located somewhat above the contact surface of the detection region.

It should be noted that in some embodiments, the detector can be located under the contact surface. For example, within a bass drum pedal. The detector would point upwards towards a user's foot.

Types of Finger Movement

Many different ways of movement in the detection region are contemplated to be recognizable by the system. For example, one preferred movement is a tapping motion (e.g., finger-tapping, foot-tapping). Or in a general sense, the contemplated movement is a motion of an object moving from point A in the detection region to point B in the detection region, and then back to point A in the detection region, within a reasonable degree of error.

Figure 10:
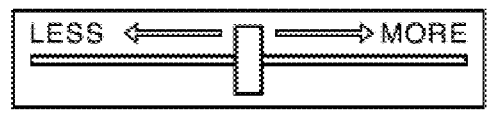
FIG. 10 is an illustration of another embodiment of explicitly indicated switch for finger-sliding.

Another preferred movement can be a finger-sliding motion on the contact surface in the detection region as shown in FIG. 10. Or in a more general sense, the movement is a motion of a moving object from point A in the detection region to point B in the detection region, within a reasonable degree of error, wherein the path of travel is a straight line.

Figure 11:
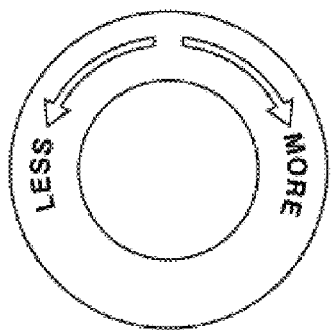
FIG. 11 is an illustration of one embodiment of explicitly indicated switch for finger-circling.
Figure 12:
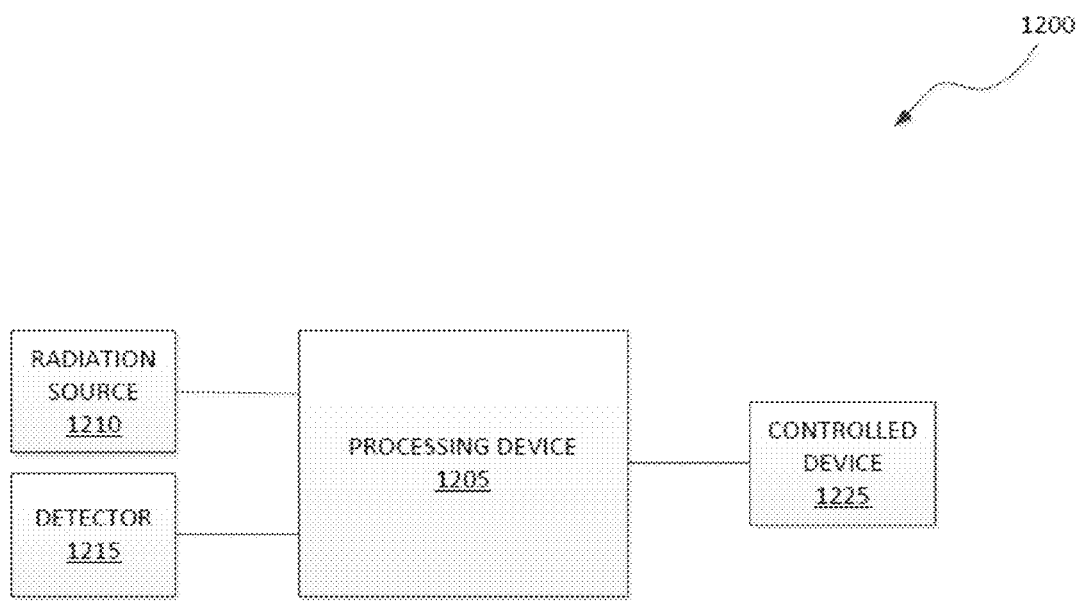
FIG. 12 is a high-level block diagram of one embodiment of a system that sends a command signal to a controlled device.
Figure 13:
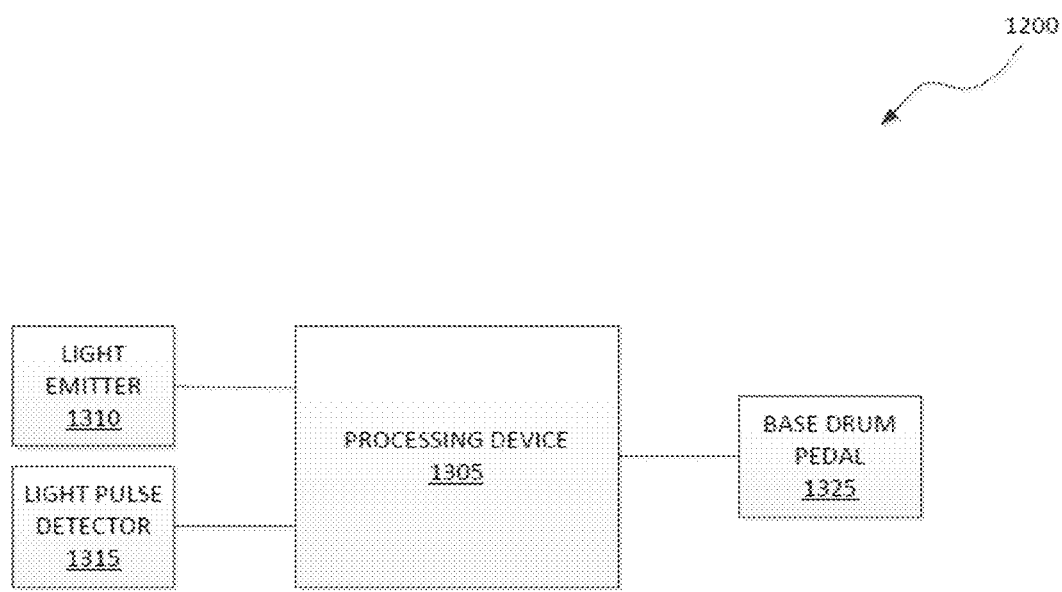
FIG. 13 is a more detailed block diagram of one embodiment of a system such as that shown in FIG. 12.
Figure 14:
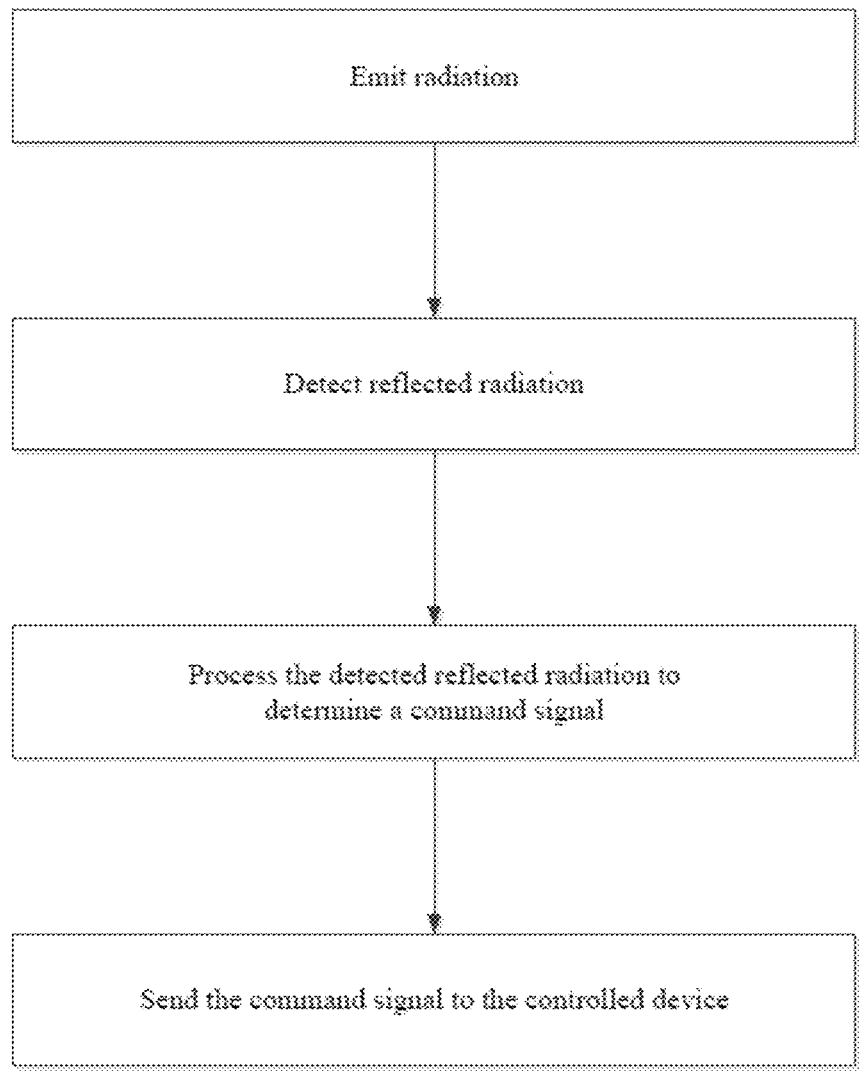
FIG. 14 is a flow diagram of one embodiment of a method for controlling at least one feature of a controlled device.

Further preferred movement can be a finger-circling motion (clock-wise motion and counter clock-wise motion) as shown in FIG. 11 on the contact surface in the detection region. Or in a more general sense, the movement is a motion of a moving object from point A in the detection region to point B in the detection region, within a reasonable degree of error, wherein the path of travel from point A to point B is not a straight line, but a curved line, a circle, or an arc.

Contemplated system is capable of detecting a moving object (animate or inanimate) as it moves from a starting point. This starting point can be a non-specified point located generally in the detection region, which is a three-dimensional region.

In one embodiment, the starting point is located on a contact surface of a stationary object within the detection region.

In another embodiment, the starting point is located mid-air within the detection region.

Microprocessor and Data Processing

The contemplated system includes a microprocessor (or processing device 1305) coupled to the detector to process the collected raw data into a processed data. The microprocessor is designed to compare the processed data to a predetermined triggering value. This predetermined triggering value can be an absolute value, a relative value, or both. When the processed data falls within a range of the predetermined triggering value, the microprocessor is contemplated to signal the system to send the command.

In a preferred embodiment, raw data on a combination of inactivity and activity is used to track motion. This is unlike any of the known range detection devices because inactivity is critical here for valid triggering. A measurement of an object is first determined to be static. (Static is relative and has a tolerance of minor movement.) From a static position, range of motion is determined by the signal level at the static position. Movement from the static position away and back to the static position produces trigger conditions.

The contemplated switch is capable of functioning as an on/off switch, or a gradient controller (e.g., for volume/flow control). The command as discussed above is contemplated to be at least one of the following: an on command, an off command, an increase in relative quantity command, a decrease in relative quantity command, an increase in relative intensity, a decrease in relative intensity, and a mode-changing command.

In the preferred embodiments, the predetermined triggering value can be one type or a mixture of types of data, such as data relating to light intensity difference, a traveling path, a relative velocity, a strength indication, a distance, and a pattern of light changes.

In one embodiment where the triggering value is relative velocity, the switch sends the command when a moving object is moving at a velocity within a predetermined range of speed. More specifically, the object is moving from point B back to point A at a velocity within a predetermined range of speed. In another embodiment, the object is moving from point A to point B at a velocity within a predetermined range of speed. In a real life example, this system is applied in a vehicle to deploy an airbag at appropriate time. When a driver enters the vehicle, the system automatically sets point A as the driver moves around in the vehicle. Many point As may be set. While the vehicle is in motion, the driver sits back and the system automatically sets the driver body in point B. Upon impact, driver body moves violently towards certain direction where certain point A was previously set. Now the system detects the relative velocity of the driver body moving back towards that certain point A from point B to determine whether or not to trigger the airbag deployment.

Similarly, the processed data can be one type or a mixture of types of data, such as data relating to light intensity difference, a traveling path, a relative velocity, a strength indication, a distance, and a pattern of light changes.

Method

Another aspect of the invention is directed to methods of turning on or controlling electronic equipments by finger-tapping or foot-tapping in an area near, under, or within close proximity to the electronic equipment, but not directly finger-tapping or foot-tapping on the electronic equipment. In one embodiment, the tapping is performed directly on a platform which is part of the electronic equipment.

In operation, the contemplated electronic equipment implements reflective light and detector that can readily turn any surfaces near the electronic equipment into a detection region. And most preferably, a user can easily move the electronic equipment to another location and a new detection region would be automatically created without requiring the user to recalibrate based on distance and angle.

As just one example further illustrating the method of FIG. 5A-5D, the desk lamp 200 has an infrared emitter 202 that directs an infrared light 203 downwardly and angled at about 45 degrees away from the vertical axis of the desk lamp 200. As shown further in FIGS. 5B and 5D, the desk lamp 200 has a detector 204 installed near the infrared emitter 202, and is also pointed downwardly and angled at about 45 degrees away from the vertical axis of the desk lamp 200. This particular desk lamp 200, is equipped with an LED illuminator 240, which shines a lit marking 207 onto the table top 236. Upon seeing the lit marking 207, a user can tap his finger on the lit marking 207 to turn on the lamp.

After the lamp 207 is turned on, the user can dim the light by placing his finger tip on the lit mark 207 (which is illuminated to show a turntable as shown in FIG. 11) and moves his finger in a counter-clock wise motion as if he is turning a knob or a small turntable. To turn off the desk lamp 200, the user simply taps his finger twice on the lit marking 207 again. The user can easily remove desk lamp 200 from table 235, and place the desk lamp 200 on a buffet table. Although the desk lamp 200 is now relocated to another piece of furniture, the infrared emitter 202, the detector 204, and the LED illuminator 240 now readily creates another lit marking 207 on the top surface of the buffet table.

Example: Light Bulb Adaptor

Another useful application of this invention is a light bulb adaptor. The contemplated light bulb adaptor is sufficiently small in size to fit in between an ordinary light bulb and an ordinary light fixture (e.g. a desk lamp similar to the one shown in FIGS. 5A-5D). The adaptor has one end having a screw thread contact to screw into the light fixture where an ordinary light bulb usually goes. The adaptor has another end for receiving the ordinary light bulb's screw thread contact. Essentially the adaptor acts as a connector connecting the light bulb to the light fixtures. The adaptor would have all of the necessary parts (i.e., detector, emitter, and processor) contained within. This way, an user can instantly make any ordinary light fixture into a special light fixture with tap-sensing switches.

Example: Electric Drum Pedal

As mentioned earlier, one of the key implementation of this invention is in electronic percussion instruments. In one embodiment, a method is provided to create an electronic bass drum by using an assembly of infrared light emitter and a detector, pointed generally downwardly in the direction towards the floor upon which a drummer would tap his foot as if there were a bass drum pedal. In one illustrated example, the electronic bass drum does not provide a LED illuminator to specifically indicate a lit marking. The drummer would visually gauge where the detection region may be by looking at where the infrared light emitter and the detector is pointing at. The electronic bass drum has a microprocessor to gather raw data about the drummer's foot-tapping such that it is able to distinguish speed, force, and distance traveled, of the foot-tapping. By being able to make these distinctions, the microprocessor can utilize a sound synthesizer to simulate actual bass drums.

Functionality in a drum pedal can be broken into two distinct areas: a sensing system and a data processing system. A demonstration has been constructed from the above concept using two COTS (Commercial Off-the-shelf Hardware) prototype units. A first unit provides sensing circuitry, an emitter with a detector, of infrared light and a processor to instrument constant detection patterns. These patterns are processed by data processor on a second unit.

Hardware-Detection Orientation

In order for the sensor to detect an object, the object must be in the path of the sensor. Two simple cases are sensing an object moving toward or away from the detector. In any case, the region must be identified. There is an IR emitter, an IR detector, and a visible LED above the detection region. The IR emitter and detector work independently from the visible LED.

Processing

Figure 15:
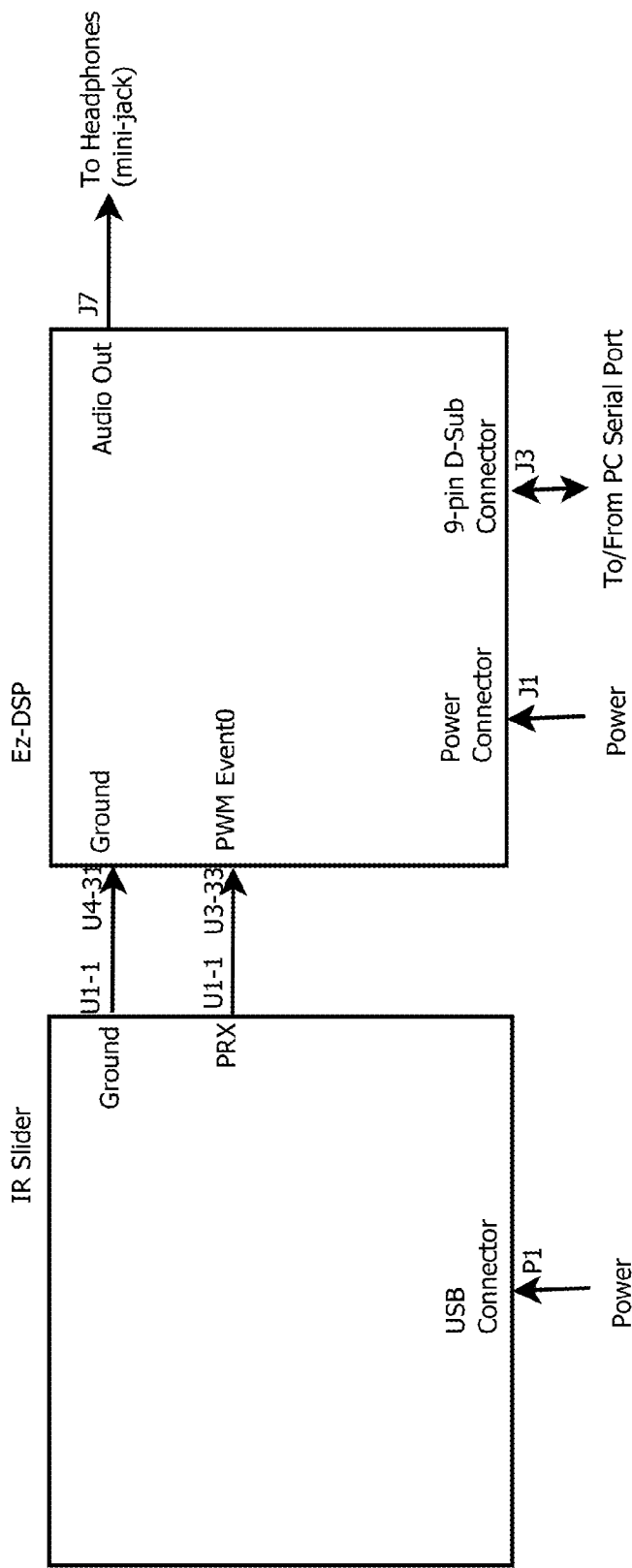
FIG. 15 is a setup diagram to process a trigger.

Integration of the two prototype units required development of an algorithm to process the trigger, and the addition of two wires to electrically connect the two systems together. See FIG. 15, a setup diagram.

A non-critical function included in the design is to use the EZ-KIT to process sound files as a response to the trigger. Again, this only demonstrates one possible use of the trigger device.

Measurements are taken on prototype 1 and delivered to prototype 2 for processing. The key functionality of prototype 1 is that it produces a pulse width modulated (PWM) signal every 16 milliseconds that corresponds to reflected intensity of an object. On prototype 2, the processor has a built-in function to read PWM signals. This built-in function allows a new sample to be stored every 16 ms that corresponds to the intensity of the reflection.

Processing on prototype 2 happens in three phases. The first phase is to average the data so that measurement noise is reduced. Stage two is the trigger algorithm. Before entering an active triggering state, a target is validated only after the object is determined to be static. At this point, thresholds are established for the target. Upon entering the active triggering state, the thresholds are used to determine whether the motion is considered to be a valid trigger condition. The third stage is non-critical determination of how to use the trigger condition. In this case, volume is determined by the amplitude of the measurement motion. A trigger event plays a pre-recorded sound that sounds like a drum.

Software—Overview

Functionally of the hardware is determined by software loaded on the system. There are two parts of the system that are controlled by software running on hardware processors: C8051F930 processor and ADSP-21065L processor. In this case, functionally was broken up into items on two processors. This is done for convenience as the two hardware modules used naturally had separate abilities that combined to produce a working system.

IR Sensor Processing

This processing takes place on C8051F930 (U1) of the IR Slider demo unit. The software is not modified from the vendor definition. IR pulses are generated every 16 ms. Presence of an object is measured by the low going output pulse of PRX. Active low pulse width is inversely proportional to the distance to the reflection of the IR from the object. (A small reading means that the object is farther away than a object with a larger reading.) IR is emitted during the pulse caption time by U1.

Algorithm Data Processing

This processing takes place on ADSP-21065L (U18) on the Ez-DSP demo unit. This software is customized to provide a tap sensing capability. An event timer on the processor measures the duration of the PRX signal from the IR Sensor Processing unit. A reading occurs once every 16 ms. (This occurs based on the IR Sensor Processing period of 16 ms.) An event counter clears when the input is high and counts when the input is low. Count increment time is 2× input clock frequency (40 Mhz), or 16.67 ns. When the input goes high, the processor is interrupted to store the count value in a circular buffer. This measurement is the input to the trigger sensing algorithm.

Figure 16:
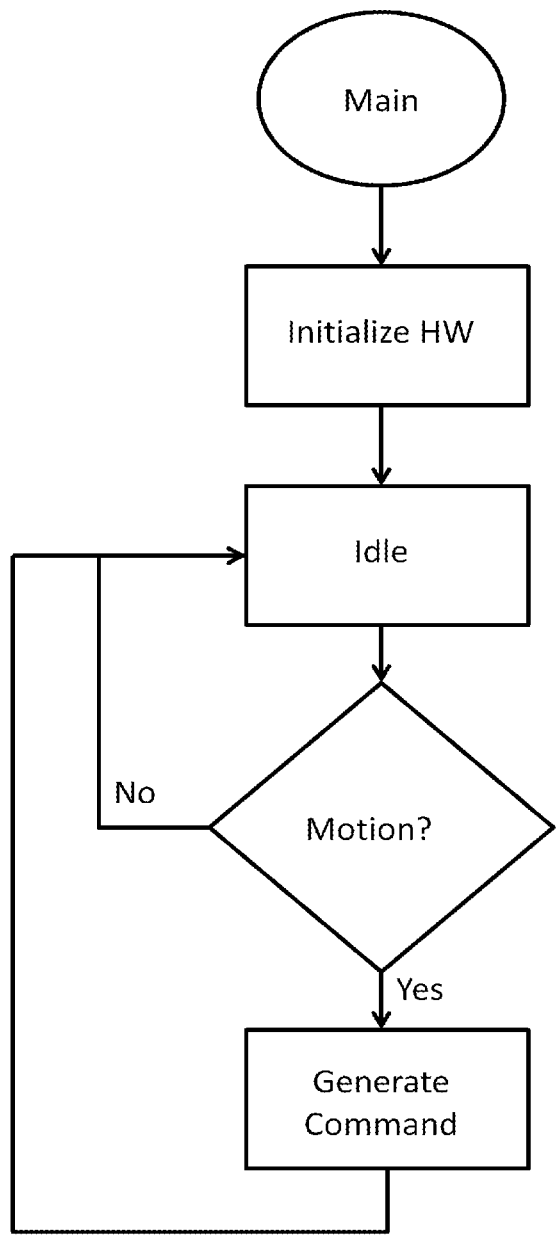
FIG. 16 is a flow diagram of data processing/trigger sensing algorithm.

A separate algorithm reads the circular buffer to determine whether a valid trigger is present. When this condition is found, a trigger message is generated. See the flow diagram of FIG. 16.

The initialize HW section configures the custom features. An event timer 0 is used to read the low going pulses of PRX:

```
asm("BIT SET IMASK TMZLI;\
    BIT CLR MODE2 INT__HI0 | INT__HI1;");
asm("BIT CLR MODE2 PWMOUT0;"); /* Set pin to input */
asm("BIT SET MODE2 PULSE__HI0;"); /* 1 to 0 transition */
asm("BIT CLR MODE2 PERIOD__CNT1;"); /* Intr Width count */
asm("BIT SET MODE2 TIMEN0;"); /* Enable timer */
```

IR Slider processes two channels by emitting with two different sources and uses time multiplexing with a single detector. In the 16 ms period, five measurements are made: 2 from single source diodes, and three custom measurements. Each emitter period occurs for less than 2.5 ms. The first measurement is made from D1:D1 is the emitter used for the tap sensing algorithm. As the first five 2.5 ms measurements use pulsing patterns, there is a non-pulsed time of 3.5 ms (16 ms-2.5×5 ms). Measuring this non-pulsed time synchronizes the sensor reading to the first of five pulsed patterns. Subsequently, the circular buffer is filled with every fifth reading. This corresponds to a single emitter/detector every 16 ms. The primary algorithm reads the circular buffer every time a new sample is read. There are two modes of operation: active and inactive. Inactive operation is when there is not enough signal level for a good measurement. This is a setting based on the position of the IR Slider. When the IR Slider is facing the floor approximately 4.5 inches above the ground at 30 degrees tilt from a normal orientation, a value of 0x3500 can be used. When actively processing samples, thresholds are used to set the degree of tap response.

A 64-sample average is used set the threshold. From the most recent 64 samples, the highest, lowest, and average values are found. If the high and low values are within 2 percent of the average, the threshold is set to (high-low) times 2.

Incoming data is monitored to determine when a tap occurs. Both monotonic increasing and decreasing input data is measured. A monotonic decreasing input in which (high-low) is greater than the threshold calculated above will cause a trigger event.

A non-critical feature of a trigger described above is a drum pedal application is that the trigger initiates a sound sample. The sound sample produces sound reproduction of a pre-recorded base drum being stuck by a mallet.

Visual LED Processing

An LED is turned ON when an object is not detected.

APPENDIX

IR Slider Schematic
Ez-DSP Schematic
Abbreviations
COTS Commercial Off-the-shelf Hardware
DSP Digital signal processor
IF Infrared
LED Light emitting diode
OEM Original Equipment Manufacture
PWM Pulse width modulation Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed herein even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims therefore include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Thus, specific embodiments and applications of tap-sensing switch have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements. The claims are thus to be understood to include what is specifically illustrated and described above, what is conceptually equivalent, what can be obviously substituted and also what essentially incorporates the essential idea of the invention. In addition, where the specification and claims refer to at least one of something selected from the group consisting of A, B, C . . . and N, the text should be interpreted as requiring only one element from the group, not A plus N, or B plus N, etc.

What is claimed is:

1. A system that sends a command signal to a controlled device, the system comprising:
  a radiation source that emits radiation to a detection region;
  a detector that detects reflected radiation based on the emitted radiation from the radiation source, wherein the reflected radiation is the emitted radiation that is reflected off of an object within the detection region;
  a processing device that is coupled to the detector to receive electrical signals based on the detected reflected radiation and to process the electrical signal into a processed data, wherein the processing device send the command signal to the controlled device that controls at least one feature of the controlled device;
  a logic having a predetermined triggering value;
  wherein the command signal is sent when the processed data matches with said predetermined triggering value;
  wherein the predetermined triggering value is at least one selected from the group consisting of a light intensity difference, a traveling path, a relative velocity, a strength indication, a distance, a pattern of light changes;
  wherein the processed data is at least one selected from the group consisting of a light intensity difference, a traveling path, a relative velocity, a strength indication, a distance, and a pattern of light changes; and
  wherein the predetermined triggering value comprises the traveling path of said moving object traveling from a point A to a point B, and returning back to said point A, wherein said point A is located
  a) on a contact surface of a stationary object within the detection region; or
  b) mid-air within the detection region, wherein the detection region is a 3-dimensional space.

2. The system as recited in claim 1, wherein the system is a controlling device that controls the controlled device, wherein the controlling controlled device is an on/off switch, or a gradient controller (e.g. volume/flow control), and wherein the command is one selected from a group consisting of an on command, an off command, an increase in relative quantity command, a decrease in relative quantity command, an increase in relative intensity, a decrease in relative intensity, and a mode-changing command.

3. The system as recited in claim 2, wherein the detection region is one selected from:
  a) a predetermined and unmarked region;
  b) a region marked by a second projected light source to shine a marking onto the stationary object, wherein said marking resembles at least one member selected from the group consisting of a button, a keyboard, a slider, and a turn-knob;
  c) a region having a marking marked by a printed graphics, wherein said marking resembles at least one member selected from the group consisting of a button, a keyboard, a slider, and a turn-knob; and
  d) a region distinguished by any of an imprint, an etching, and a modified surface material.

4. The system as recited in claim 3, wherein the moving object is a finger or a foot of the user, and the traveling path from said point A to said point B and back to said point A is a finger-tapping motion or a foot-tapping motion in the detection region.

5. The system as recited in claim 4, wherein said finger-tapping motion or a foot-tapping motion is performed onto a stationary object, and wherein the stationary object is not a physical part of the system, and is not a physical part of the electronic equipment, and said stationary object is any of a separate fixture, a separate furniture piece, a floor, and a wall.

6. The system as recited in claim 5, wherein the controlled device is a consumer product.

7. The system as recited in claim 6, wherein the consumer product is a lighting fixture.

8. The system as recited in claim 6, wherein the consumer product is an audio/visual equipment.

9. The switch as recited in claim 5, wherein the controlled device is a musical instrument.

10. The switch as recited in claim 9, wherein the musical instrument is an electric bass drum.

11. The switch as recited in claim 10, wherein a relatively faster movement traveling from said point A to point B triggers the switch to send a command to produce a relatively louder bass drum sound; and wherein a relatively slower movement traveling from said point A to point B triggers the switch to send a command to produce a relatively lower bass drum sound.

12. A method for controlling at least one feature of a controlled device, the method comprising:

having a radiation source to emit radiation to a detection region;

having a detector to detect a raw data from a reflected radiation based on the emitted radiation from the radiation source;

a logic having a predetermined triggering value;

having a processor and said logic to process the raw data into a processed data, and compare the processed data to said predetermined triggering value;

send a command signal, if there is a match between the processed data and the predetermined triggering value, to control at least one feature of the controlled device;

wherein the predetermined triggering value is at least one selected from the group consisting of a light intensity difference, a traveling path, a relative velocity, a strength indication, a distance, a pattern of light changes;

wherein the processed data is at least one selected from the group consisting of a light intensity difference, a traveling path, a relative velocity, a strength indication, a distance, and a pattern of light changes; and wherein the predetermined triggering value comprises the traveling path of said moving object traveling from a point A to a point B, and returning back to said point A.

13. The method as recited in claim 12, wherein the logic is configured to process raw data in at least one type of value from the group consisting of a light intensity difference, a traveling path, a relative velocity, a distance, and a pattern of light changes.

14. The method as recited in claim 13, wherein the produced trigger to the electronic device effectuates at least one of the following functions: switching on/off, provide gradient control, to increase in quantity, to decrease in quantity, to increase in relative intensity, to decrease in relative intensity, and changing mode.

15. The method as recited in claim 14, wherein the predetermined triggering value is a relative velocity.

16. The method as recited in claim 14, wherein said point A is located
 a) on a contact surface of a stationary object within the detection region; or
 b) mid-air within the detection region, wherein the detection region is a 3-dimensional space.

17. The method as recited in claim 16, wherein the moving object is a finger or a foot of the user, and the traveling path to which the raw data is collected is a finger-tapping or a foot-tapping motion.

18. The method as recited in claim 17, providing the detection region such that the detection region is one selected from:
 a) a predetermined and unmark region;
 b) a region marked by a second projected light source to shine a marking onto the stationary object, wherein said marking resembles at least one member selected from the group consisting of a button, a keyboard, a slider, and a turn-knob; and
 c) a region having a marking marked by a printed graphics, wherein said marking resembles at least one member selected from the group consisting of a button, a keyboard, a slider, and a turn-knob; and
 d) a region distinguished by any of an imprint, an etching, and a modified surface material.

19. The method as recited in claim 18, wherein the stationary object is not a physical part of the system, and is not a physical part of the electronic equipment, and said stationary object is any of a separate fixture, a separate furniture piece, a floor, and a wall.

* * * * *